(12) United States Patent
Nakatsuka et al.

(10) Patent No.: US 7,030,538 B2
(45) Date of Patent: Apr. 18, 2006

(54) PIEZOELECTRIC TRANSFORMER, PIEZOELECTRIC TRANSFORMER UNIT, INVERTER CIRCUIT, LIGHT EMISSION CONTROL DEVICE, AND LIQUID CRYSTAL DISPLAY DEVICE

(75) Inventors: Hiroshi Nakatsuka, Katano (JP); Katsu Takeda, Osaka (JP); Katsunori Moritoki, Takatsuki (JP); Hiroshi Fukushima, Katano (JP); Yusuke Adachi, Toyonaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/172,589

(22) Filed: Jun. 14, 2002

(65) Prior Publication Data

US 2002/0190611 A1 Dec. 19, 2002

(30) Foreign Application Priority Data

Jun. 14, 2001 (JP) ............................. 2001-180443

(51) Int. Cl.
H01L 41/08 (2006.01)
(52) U.S. Cl. ...................................... 310/312; 310/366
(58) Field of Classification Search ................ 310/320, 310/324, 366, 317, 319, 312
See application file for complete search history.

(56) References Cited

U.S. PATENT DOCUMENTS

| | | | |
|---|---|---|---|
| 2,976,501 A | 3/1961 | Mattiat | |
| 3,764,848 A * | 10/1973 | Berlincourt | 315/55 |
| 4,896,069 A * | 1/1990 | Rosenberg et al. | 310/339 |
| 5,998,937 A * | 12/1999 | Nishigaki | 315/209 PZ |
| 6,057,633 A * | 5/2000 | Inoi et al. | 310/345 |
| 6,075,325 A * | 6/2000 | Kouno et al. | 315/307 |
| 6,144,142 A | 11/2000 | Face, Jr. et al. | |
| 6,188,163 B1 * | 2/2001 | Danov | 310/366 |
| 6,268,681 B1 * | 7/2001 | Yamaguchi et al. | 310/316.01 |
| 6,320,301 B1 * | 11/2001 | Noma et al. | 310/359 |
| 6,667,566 B1 * | 12/2003 | Kim et al. | 310/366 |

FOREIGN PATENT DOCUMENTS

| | | |
|---|---|---|
| GB | 1325058 | 8/1973 |
| JP | 4-167504 | 6/1992 |
| JP | 4-338685 | 11/1992 |
| JP | 2666562 | 6/1997 |
| JP | 2830503 | 9/1998 |
| JP | 2000-49399 | 2/2000 |

OTHER PUBLICATIONS

Hu, et al., "A ring-shaped piezoelectric transformer operating in the third symmetric extensional vibration mode", Sensors and Actuators A 88 (2001) 79-86.

\* cited by examiner

Primary Examiner—Mark Budd
(74) Attorney, Agent, or Firm—Hamre, Schumann, Mueller & Larson, P.C.

(57) ABSTRACT

A low loss, small scale piezoelectric transformer, suited for a cold cathode tube load, and having a high effective coupling factor, is provided using a piezoelectric plate having a single polarization direction. Controlling the dimensions of the third electrode portion 15a constituting the high impedance portion makes it possible easily to adjust the capacitance of the electrostatic capacitor formed between the first electrode portion 12 and the third electrode portion in accordance with the load. Also, the second electrode portion 13 and the fourth electrode portion 15b constituting the low impedance portion are substantially equal in area and the third electrode portion and the fourth electrode portion are formed in one piece, so that energy propagation efficiency can be increased. Consequently, the effective coupling factor resulting from the electrode structure and the vibration mode can be kept high even if the capacitance is changed freely, and thus high element efficiency and a small amount of generated heat can be maintained and stress can be decreased.

21 Claims, 16 Drawing Sheets

FI.G.8C

PIEZOELECTRIC TRANSFORMER, PIEZOELECTRIC TRANSFORMER UNIT, INVERTER CIRCUIT, LIGHT EMISSION CONTROL DEVICE, AND LIQUID CRYSTAL DISPLAY DEVICE

BACKGROUND OF THE INVENTION

1. Field of the Invention

The present invention relates to a piezoelectric transformer that can be used in various high voltage generating devices, and in particular to a piezoelectric transformer used in an inverter circuit for carrying out the light emission control of a cold cathode tube.

2. Description of Related Art

FIG. 12A is an outside perspective view showing the structure of a Rosen-type piezoelectric transformer, which is a typical structure for conventional piezoelectric transformers. FIG. 12B is a cross-sectional view in the length direction of the piezoelectric transformer shown in FIG. 12A. The advantages of this piezoelectric transformer are that it is smaller than magnetic transformers, that it is nonflammable, and that it does not generate noise due to magnetic induction, for example.

The portion denoted by the numeral 2 is the low impedance portion of the piezoelectric transformer, which serves as the input portion when the piezoelectric transformer is used to step up voltage. The low impedance portion 2 is polarized in the thickness direction (indicated by PD in FIGS. 12A and 12B) of a piezoelectric ceramic plate 1 (hereinafter, referred to as piezoelectric plate), an electrode 3U is disposed on the first principal face, and an electrode 3D is disposed on the second principal face in the thickness direction. On the other hand, the portion denoted by the numeral 3 is the high impedance portion, which serves as the output portion when the piezoelectric transformer is used to step up voltage. The high impedance portion 3 is polarized in the length direction (indicated by PL in FIGS. 12A and 12B) of the piezoelectric plate 1, and an electrode 4 is disposed on the end face of the length direction. In piezoelectric transformers configured in this way, the transverse effect of the piezoelectric longitudinal vibration is utilized in the low impedance portion 2 and the longitudinal effect of the piezoelectric longitudinal vibration is utilized in the high impedance portion 3.

The operation of a conventional piezoelectric transformer with the above configuration is described next using FIG. 13.

FIG. 13 is an equivalent circuit diagram approximated with the concentrated constants near the resonance frequency of the piezoelectric transformer in FIGS. 12A and 12B. In FIG. 13, Cd1 and Cd2 are the bound capacitors on the input side and the output side, respectively, A1 (input side) and A2 (output side) are the force factors, m is the equivalent mass, C is the equivalent compliance, and Rm is the equivalent mechanical resistance. In the piezoelectric transformer shown in FIGS. 12A and 12B, the force factor A1 is larger than A2, and the voltage is stepped up by two equivalent ideal transformers 1301 and 1302 in FIG. 13. The piezoelectric transformer includes a series resonant circuit made of the equivalent mass m and the equivalent compliance C, and thus the output voltage has a value equal to or greater than the transformation ratio of the transformer, in particular when the value of the load resistance is large.

Besides this Rosen-type piezoelectric transformer, another piezoelectric transformer known in the art utilizes the radially expanding vibration of a disk, as shown in FIGS. 14A and 14B. FIG. 14A is a front view of this piezoelectric transformer and FIG. 14B is a cross-sectional view taken along the line A–A' in FIG. 14A. In FIG. 14B, the low impedance portion is denoted by the numeral 224 and the high impedance portions are denoted by the numerals 223 and 225. The low impedance portion 224 is made of electrodes 221U and 221D, and the high impedance portions 223 and 225 are made of an electrode 222 and the electrode 221U or 221D. As in the case of the Rosen-type piezoelectric transformer shown in FIGS. 12A and 12B, the low impedance portion 224 utilizes the transverse effect and the high impedance portions 223 and 225 utilize the longitudinal effect.

A piezoelectric transformer with this structure is represented by the equivalent circuit of FIG. 13, like the Rosen-type piezoelectric transformer of FIGS. 12A and 12B, and also operates in the same way.

In a piezoelectric transformer like that shown in FIGS. 14A and 14B, however, the low impedance portion 224 utilizing the transverse effect must be polarized in the thickness direction of the disk and the high impedance portions 223 and 225 utilizing the longitudinal effect must be polarized in the radial direction of the disk. This causes extremely intense stress on the piezoelectric transformer during the poling process, which increases the risk of cracks or the like occurring near the boundary between the low impedance portion 224 and the high impedance portions 223 and 225.

To solve this problem, JP 2666562B proposes a piezoelectric transformer that employs the radially expanding vibration of a disk and utilizes the transverse effect for both the low impedance portions and the high impedance portions. The structure of the piezoelectric transformer disclosed in JP 2666562B is shown in FIGS. 15A and 15B. FIG. 15A is a front view of this piezoelectric transformer and FIG. 15B is a cross-sectional view taken along the line A–A' in FIG. 15A.

However, since the piezoelectric transformer shown in FIGS. 15A and 15B employs the transverse effect for the low impedance portions 215 and 217 and the high impedance portion 216 alike, the capacitance of the output portion of the piezoelectric transformer becomes larger than those of the Rosen-type piezoelectric transformer shown in FIGS. 12A and 12B and the piezoelectric transformer shown in FIGS. 14A and 14B, which utilizes the radially expanding vibration of a disk.

It is well known in the art that when a cold cathode tube is used as the load for the piezoelectric transformer, the piezoelectric transformer can be driven efficiently by designing the output impedance of the piezoelectric transformer and the load impedance of the cold cathode tube to be substantially equal. However, using the transverse effect for the output portion makes the output impedance of the piezoelectric transformer much smaller than the load impedance of the cold cathode tube, which causes a drop in efficiency when driving.

One approach to solving this problem is proposed in JP 2000-49399A, which discloses the structure of a piezoelectric transformer employing a piezoelectric plate that has a single polarization direction. FIG. 16 shows the structure of the piezoelectric transformer proposed in JP 2000-49399A. In FIG. 16, the numerals 201 and 204 denote electrodes constituting the high impedance portion and the numerals 202 and 204 denote electrodes constituting the low impedance portion. Here, the capacitance of the output portion of the piezoelectric transformer can be controlled by forming a small electrode 201 on the principal face in the thickness direction of a piezoelectric body 203. However, making the electrode 201 small increases the region that does not contribute to the propagation of energy, therefore lowering the coupling factor resulting from the electrode structure and the vibration mode (hereinafter, referred to as the effective coupling factor). This is problematic because it increases loss, lowers element efficiency, increases the amount of generated heat, and also increases stress.

SUMMARY OF THE INVENTION

Accordingly, it is an object of the present invention to provide a low loss, small scale piezoelectric transformer employing a piezoelectric plate having a single polarization direction, suited for a cold cathode tube load, and with a high effective coupling factor.

To achieve the above object, a first piezoelectric transformer according to the present invention is provided with a piezoelectric plate polarized entirely in the thickness direction, a first electrode portion formed in the center of a first principal face in the thickness direction of the piezoelectric plate, a second electrode portion enclosing the first electrode portion and formed from the inside to the perimeter on the first principal face, and separated from the first electrode portion by an insulating region, a third electrode portion formed on a second principal face in the thickness direction of the piezoelectric plate in a region in opposition to the first electrode portion and the insulating region, and which is for adjusting a capacitance of an electrostatic capacitor formed between it and the first electrode portion, and a fourth electrode portion formed integrally with the third electrode portion on the second principal face and having an area substantially equal to that of the second electrode portion. A high impedance portion is made of a portion formed by the first electrode portion and the third electrode portion in the thickness direction of the piezoelectric plate, and a low impedance portion is made of a portion formed by the second electrode portion and the fourth electrode portion in the thickness direction of the piezoelectric plate.

This configuration makes it possible to adjust easily the capacitance of the electrostatic capacitor formed between the first electrode portion and the third electrode portion in accordance with the load by controlling the dimensions of the third electrode portion constituting the high impedance portion. Also, the second electrode portion and the fourth electrode portion constituting the low impedance portion are substantially equal in area and the third and fourth electrode portions are formed in one piece, thereby increasing the energy propagation efficiency, maintaining a high effective coupling factor, and reducing loss, so that element efficiency can be increased and the amount of generated heat can be lowered, and furthermore stress also can be reduced.

It is preferable that in the first piezoelectric transformer the piezoelectric plate is shaped as a circular disk. It is even more preferable that the piezoelectric plate is shaped as a rectangular plate substantially equal in length and width. Thus, manufacturing discrepancies can be kept down and the device can be manufactured easily.

It is preferable that in the first piezoelectric transformer the space between the first electrode portion and the second electrode portion separated by the insulating region is equal to or greater than the thickness of the piezoelectric plate, so that increases in the capacitance of the high impedance portion due to unnecessary polarization of the insulating region, where the electrodes are not formed, can be prevented.

To achieve the above object, a second piezoelectric transformer according to the present invention is provided with a piezoelectric plate polarized entirely in the thickness direction and shaped as a rectangular plate substantially equal in length and width, a first electrode portion formed in a center portion on a first principal face in the thickness direction of the piezoelectric plate, a second electrode portion enclosing the first electrode portion and formed to the interior of a first insulating region provided at the perimeter portion on the first principal face and separated from the first electrode portion by a second insulating region, a third electrode portion formed on a second principal face in the thickness direction of the piezoelectric plate in a region in opposition to the first electrode portion and having an area substantially equal to that of the first electrode portion, and a fourth electrode portion formed integrally with the third electrode portion on the second principal face and extending from the third electrode portion to the perimeter portion along the center lines of the four edges, and which is for adjusting a capacitance of an electrostatic capacitor formed between it and the second electrode portion. A low impedance portion is made of a portion formed by the first electrode portion and the third electrode portion in the thickness direction of the piezoelectric plate and a high impedance portion is made of a portion formed by the second electrode portion and the fourth electrode portion in the thickness direction of the piezoelectric plate.

This configuration makes it possible to adjust easily the capacitance of the capacitor formed between the second electrode portion and the fourth electrode portion in accordance with the load by controlling the dimensions of the fourth electrode portion constituting the high impedance portion. Also, the first electrode portion and the third electrode portion constituting the low impedance portion are substantially equal in area and the third and fourth electrode portions are formed in one piece, thereby increasing the energy propagation efficiency, maintaining a high effective coupling factor, and reducing loss, so that element efficiency can be increased and the amount of generated heat can be lowered, and furthermore stress also can be reduced. Further, providing a first insulating region on the first principal face of the piezoelectric plate and insulating regions where electrodes are not formed at the four corners on the second principal face makes it possible to ensure safety with respect to the high voltage output from the second and fourth electrode portions constituting the high impedance portion in a case where the piezoelectric transformer is used for stepping up voltage.

To achieve the above object, a third piezoelectric transformer according to the present invention is provided with a piezoelectric plate polarized entirely in the thickness direction and shaped as a rectangular plate substantially equal in length and width, a first electrode portion formed in linear symmetry about the diagonals on a first principal face in the thickness direction of the piezoelectric plate, a second electrode portion formed in a middle portion of each of four perimeter portions on the first principal face, a third electrode portion formed on a second principal face in the thickness direction of the piezoelectric plate in a region in opposition to the first electrode portion and having an area substantially equal to that of the first electrode portion, and a fourth electrode portion formed integrally with the third electrode portion on the second principal face and extending from the third electrode portion to the perimeter portions along the center lines of the four edges, and which is for adjusting a capacitance of an electrostatic capacitor formed between it and the second electrode portion. A low impedance portion is made of a portion formed by the first electrode portion and the third electrode portion in the thickness direction of the piezoelectric plate and a high impedance portion is made of a portion formed by the second electrode portion and the fourth electrode portion in the thickness direction of the piezoelectric plate.

This configuration makes it possible to adjust easily the capacitance of the capacitor formed between the second electrode portion and the fourth electrode portion in accordance with the load by controlling the dimensions of the fourth electrode portion constituting the high impedance portion. Also, the first electrode portion and the third electrode portion constituting the low impedance portion are substantially equal in area and the third and fourth electrode portions are formed as a single unit. This increases the energy propagation efficiency, maintains a high effective coupling factor, and reduces loss, so that element efficiency can be increased and the amount of heat generated can be lowered, and furthermore stress also can be reduced. Further, forming four second electrode portions in the middle of each of the four perimeter portions makes it possible to receive output voltage from the second electrode portion in an position optimal for an arrangement of the load and the outside circuits in a case where the piezoelectric transformer is used for stepping up voltage.

In the second and third piezoelectric transformers it is preferable that the first electrode portion is geometrically similar to the outer dimensions of the piezoelectric plate.

To achieve the above object, a piezoelectric transformer unit according to the present invention is provided with the first or the second piezoelectric transformer, a conductive elastic body made by alternately laminating conducting layers and insulating layers and for supporting the piezoelectric transformer and electrically connecting to the electrode portions of the piezoelectric transformer, and a casing for accommodating and supporting the piezoelectric transformer and the conductive elastic body as well as electrically connecting the electrode portions of the piezoelectric transformer to outside portions via the conductive elastic body.

In this piezoelectric transformer unit it is preferable that the conductive elastic body includes a first conductive elastic body in contact with the first principal face of the piezoelectric transformer and having a length substantially equal to the length of the piezoelectric transformer and a second conductive elastic body in contact with the second principal face of the piezoelectric transformer and having a length substantially equal to the width of the piezoelectric transformer, wherein the first conductive elastic body and the second conductive elastic body are perpendicular to one another and sandwich the piezoelectric transformer.

A piezoelectric transformer unit of this configuration can protect the piezoelectric transformer from external impact and ensure a good state of contact with the electrode portions.

To achieve the above object, a first inverter circuit according to the present invention is provided with the third piezoelectric transformer and a drive control circuit for the piezoelectric transformer.

To achieve the above object, a second inverter circuit according to the present invention is provided with the piezoelectric transformer unit according to the present invention and a drive control circuit for the piezoelectric transformer unit.

The first and the second inverter circuits enable the device to have a thin profile.

To achieve the above object, a light emission control device according to the present invention is provided with the first or the second inverter circuit and a cold cathode tube serving as a load for the piezoelectric transformer.

This configuration enables the device to be made small.

To achieve the above object, a liquid crystal display device according to the present invention is provided with the light emission control device according to the present invention and a liquid crystal panel in which brightness control is performed by the light emission control device.

This configuration makes it possible to narrow the width of the liquid crystal monitor or the liquid crystal display, for example.

BRIEF DESCRIPTION OF THE DRAWINGS

FIG. 8C is a plan view of the second principal face in the thickness direction showing another structure of the piezoelectric transformer according to the first embodiment of the present invention.

DESCRIPTION OF THE PREFERRED EMBODIMENTS

Hereinafter, preferred embodiments of the present invention are described with reference to the drawings.

First Embodiment

Figure 1A:
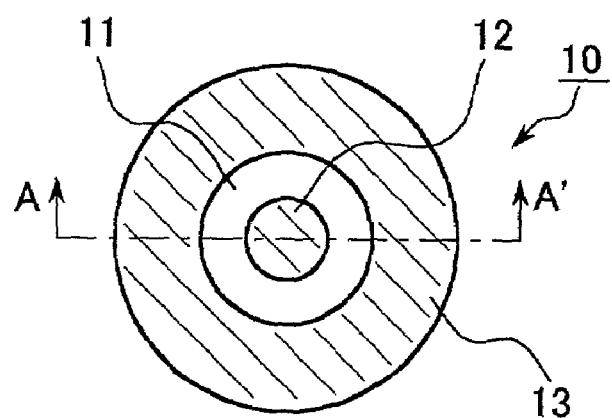
FIG. 1A is a plan view of the first principal face in the thickness direction showing the structure of a piezoelectric transformer according to the first embodiment of the present invention.
Figure 1B:
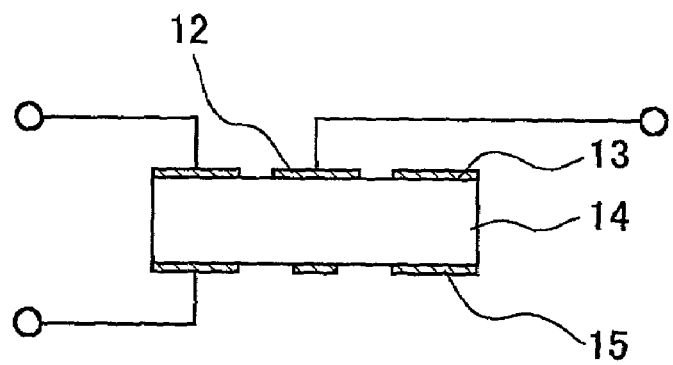
FIG. 1B is a cross-sectional view taken along the line A–A' in FIG. 1A.
Figure 1C:
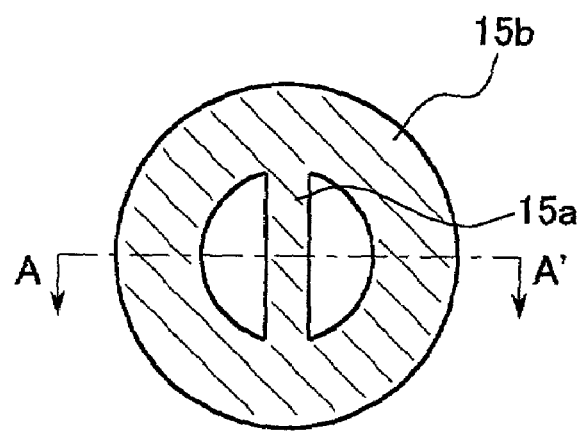
FIG. 1C is a plan view of the second principal face in the thickness direction showing the structure of the piezoelectric transformer according to the first embodiment of the present invention.

FIG. 1A is a plan view of the first principal face in the thickness direction, showing the structure of a piezoelectric transformer according to the first embodiment of the present invention. FIG. 1B is a cross-sectional view taken along the line A–A' in FIG. 1A. FIG. 1C is a plan view of the second principal face in the thickness direction, showing the structure of the piezoelectric transformer according to the first embodiment of the present invention.

In FIGS. 1A, 1B, and 1C, a piezoelectric transformer 10 is made of a piezoelectric plate 14 polarized entirely in the thickness direction, an electrode 12 (first electrode portion) formed in the center portion on the first principal face in the thickness direction of the piezoelectric plate 14, an electrode 13 (second electrode portion) enclosing the electrode 12 and formed on the first principal face from the interior to the edge and separated from the electrode 12 by an insulating region 11, an electrode section 15a (third electrode portion) formed on the second principal face in the thickness direction of the piezoelectric plate 14 in a region in opposition to the electrode 12 and the insulating region 11 and which is for adjusting the capacitance of the electrostatic capacitor formed between it and the electrode 12, and an electrode section 15b (fourth electrode portion) formed on the second principal face integrally with the electrode section 15a and having an area substantially equal to that of the electrode 13. Here, the electrode sections 15a and 15b are formed in one piece as a common electrode 15 of the primary side and secondary side.

The high impedance portion is made of the portion formed by the electrode 12 and the electrode section 15a in the thickness direction of the piezoelectric plate 14, and the low impedance portion is made of the portion formed by the electrode 13 and the electrode section 15b in the thickness direction of the piezoelectric plate 14.

The piezoelectric plate 14 is made of PZT, for example, which is piezoelectric, and voltage applied across the primary side electrodes 13 and 15 is stepped up proportionally so that a high voltage can be output from the secondary side electrode 12.

It is preferable that the space between the electrodes 12 and 13 separated by the insulating region 11 is equal to or greater than the thickness of the piezoelectric plate 14, so that increases in the capacitance of the high impedance portion due to unnecessary polarization of the insulating region 11 can be prevented.

Figure 13:
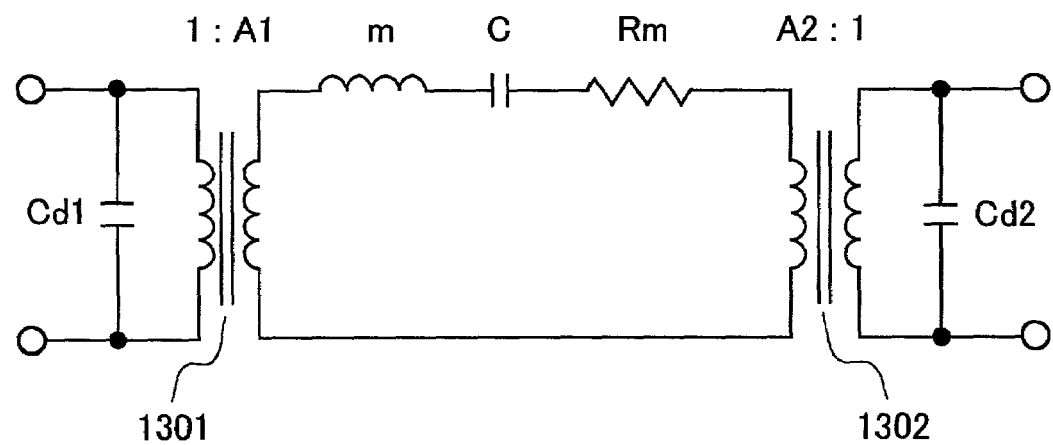
FIG. 13 is an equivalent circuit diagram approximated with concentrated constants near the resonance frequency of the piezoelectric transformer of FIGS. 12A and 12B.
Figure 14A:
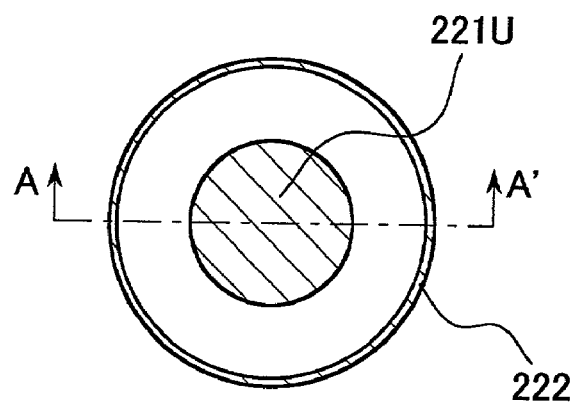
FIG. 14A is a front view showing the structure of a conventional piezoelectric transformer employing the radially expanding vibration of a disk.
Figure 14B:
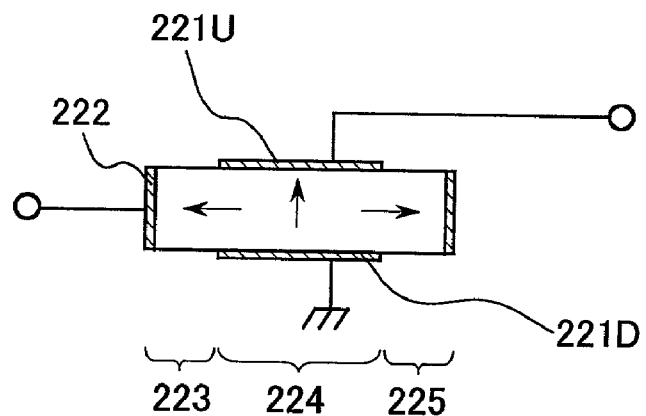
FIG. 14B is a cross-sectional diagram taken along the line A–A' of FIG. 14A.
Figure 15A:
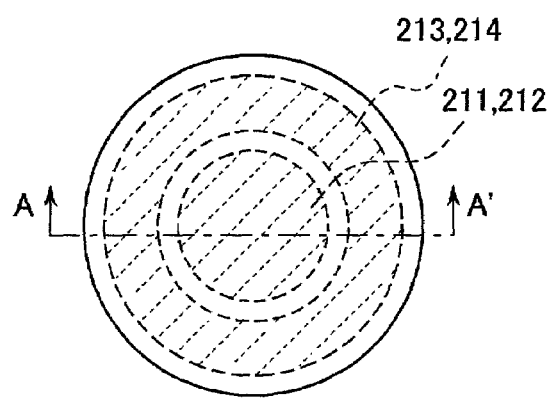
FIG. 15A is a front view showing the structure of a conventional piezoelectric transformer employing the radially expanding vibration of a disk.
Figure 15B:
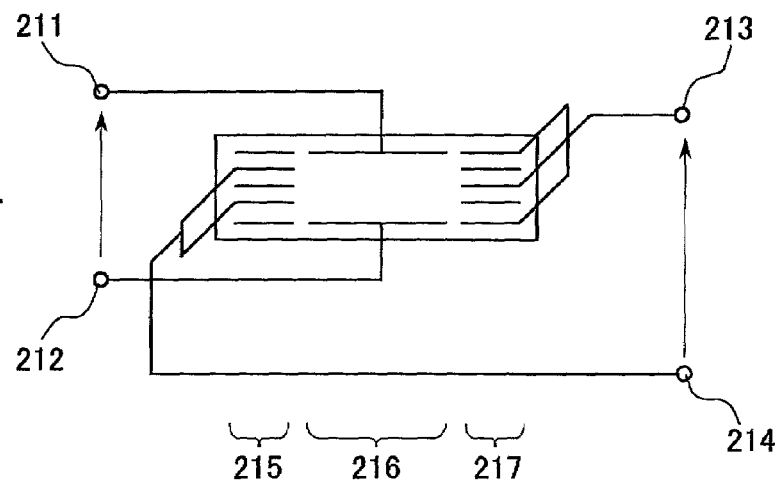
FIG. 15B is a cross-sectional diagram taken along the line A–A' of FIG. 15A.
Figure 16:
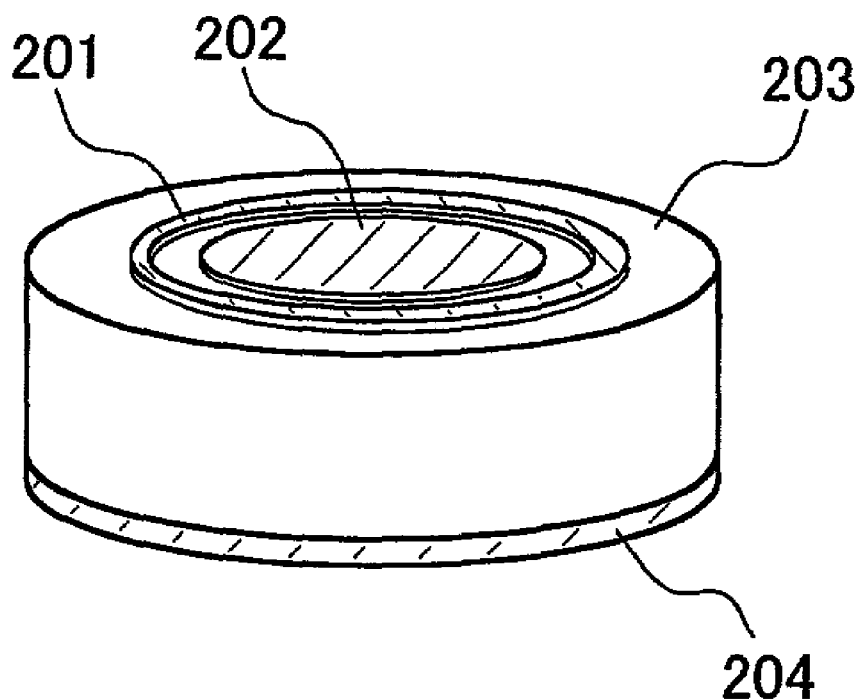
FIG. 16 is a perspective view showing the structure of another conventional piezoelectric transformer employing the radially expanding vibration of a disk.

As in the conventional example, the piezoelectric transformer 10 with this configuration is represented by the equivalent circuit shown in FIG. 13. In the present embodiment, however, the dimensions of the electrode section 15a constituting the high impedance portion are controlled to enable the capacitance of the electrostatic capacitor formed between the electrode 12 and the electrode section 15a to be adjusted easily in accordance with the load. Furthermore, the area of the electrode 13 and the electrode section 15b, which make up the low impedance portion, is substantially equal, and the electrode section 15a and the electrode section 15b are formed in one piece as the electrode 15, so that the energy propagation efficiency is increased, the effective coupling factor is kept high, and loss is reduced. This makes it possible to increase element efficiency and to reduce the amount of generated heat, as well as to lower the stress.

A piezoelectric transformer unit including a support structure for the piezoelectric transformer shown in FIGS. 1A, 1B, and 1C is described next using FIGS. 2, 3, 4A, 4B, 4C, and 4D.

Figure 2:
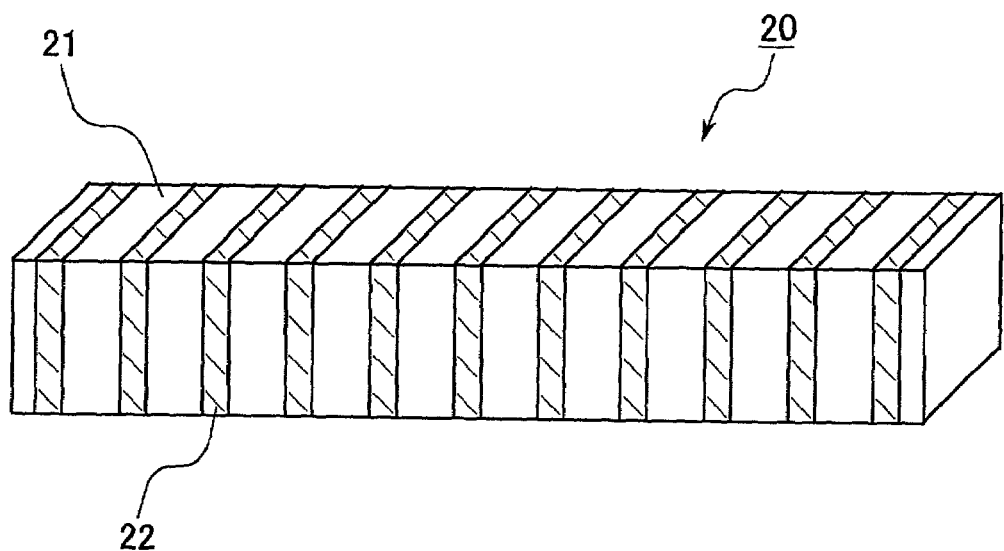
FIG. 2 is a perspective view schematically showing the configuration of a conductive elastic body 20 for supporting the piezoelectric transformer 10 and making electrical contact.

FIG. 2 is a perspective view schematically showing the configuration of a conductive elastic body 20 used in the piezoelectric transformer unit according to this embodiment. In FIG. 2, the numeral 22 denotes conductive layers and the numeral 21 denotes insulating layers, which may be made of a silicon based elastic body. The conductive elastic body 20 is made by alternately laminating the conductive layers 22 and the insulating layers 21 in the length direction.

Figure 3:
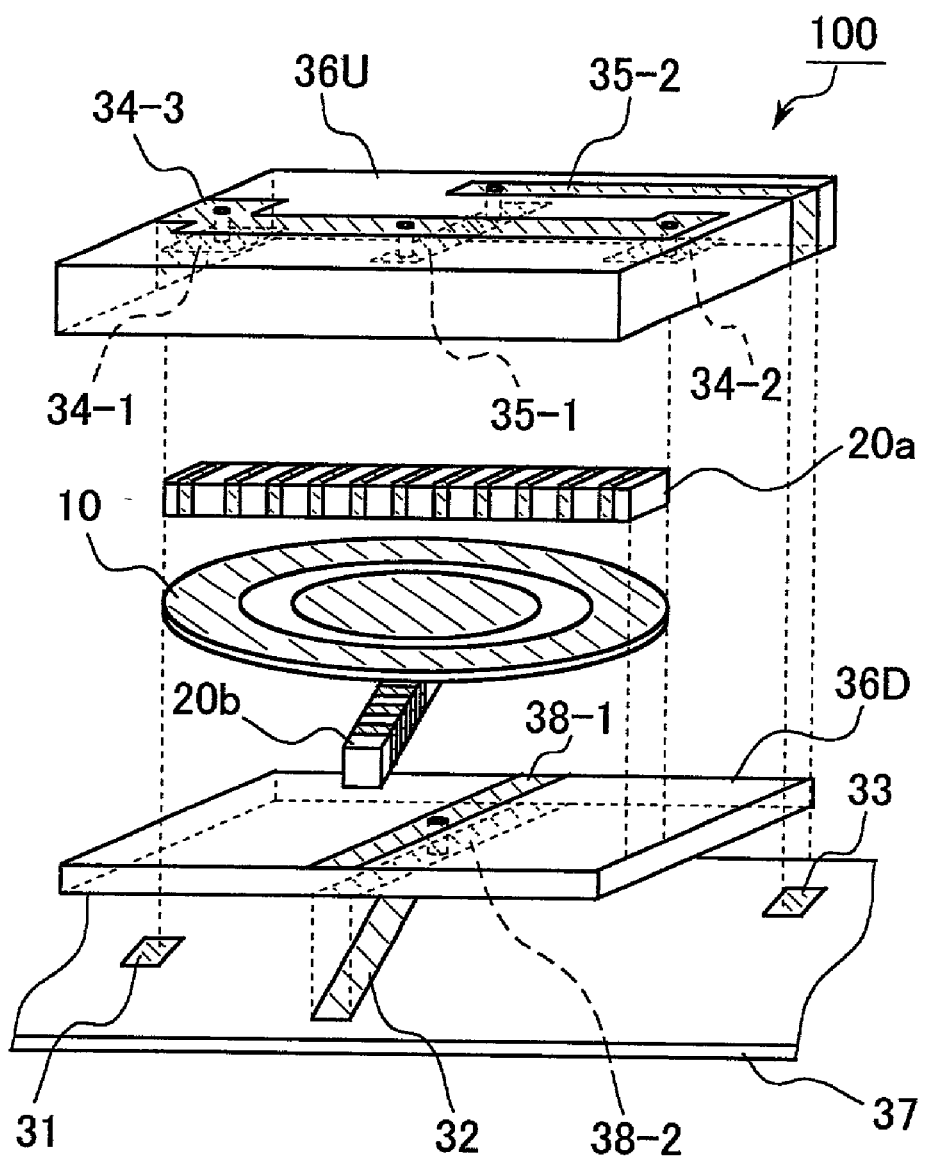
FIG. 3 is an exploded view of the piezoelectric transformer unit for accommodating and supporting the piezoelectric transformer 10.

FIG. 3 is an exploded view of the piezoelectric transformer unit according to this embodiment. In FIG. 3, a conductive elastic body 20a (first conductive elastic body) is in contact with the first principal face of the piezoelectric transformer 10 such that it is perpendicular to a conductive elastic body 20b (second conductive elastic body) in contact with the second principal face of the piezoelectric transformer 10.

Next, the conductive elastic body 20a is brought into contact with electrodes 34-1, 35-1, and 34-2 formed on the inside surface of an upper casing 36U and the conductive elastic body 20b is brought into contact with an electrode 38-1 formed on the upper surface of a lower casing 36D. The piezoelectric transformer 10 and the conductive elastic bodies 20a and 20b are then put inside the upper casing 36U and fixed and held stationary by the lower casing 36D to complete a piezoelectric transformer unit 100. Here, the upper casing 36U and the lower casing 36D compress the conductive elastic bodies 20a and 20b about several percent to several dozen percent by pressing them to ensure they are supported and conductive.

An electrode 34-3 on the outer surface of the upper casing 36U electrically connected to the electrode 34-1, an electrode 38-2 on the bottom surface of the lower casing 36D electrically connected to the electrode 38-1, and an electrode 35-2 on the outer surface of the upper casing 36U electrically connected to the electrode 35-1 are fixed, by soldering or the like, to lands 31, 32, and 33, respectively, formed on a substrate 37 for making electrical contact therewith, thus mounting the piezoelectric transformer unit 100 to the substrate 37.

In this embodiment, the electrodes 34-3 and 35-2 on the outer surface of the upper casing 36U may be formed integrally with the casing 36U through insert molding. Also, the electrodes 34-1, 34-2, 34-3, 35-1, and 35-2 of the upper casing 36U, the electrodes 38-1 and 38-2 of the lower casing 36D, and the lands 31, 32, and 33 of the substrate 37 may be formed by 0.1 mm thick phosphor bronze with their surface gold plated.

Figure 4A:
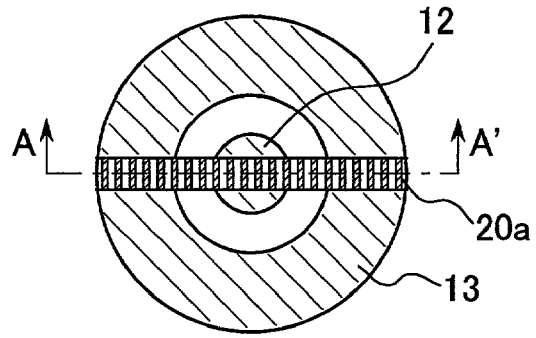
FIG. 4A is a plan view showing the arrangement of the piezoelectric transformer 10 and the conductive elastic body 20a in contact with the first principal face thereof.
Figure 4B:
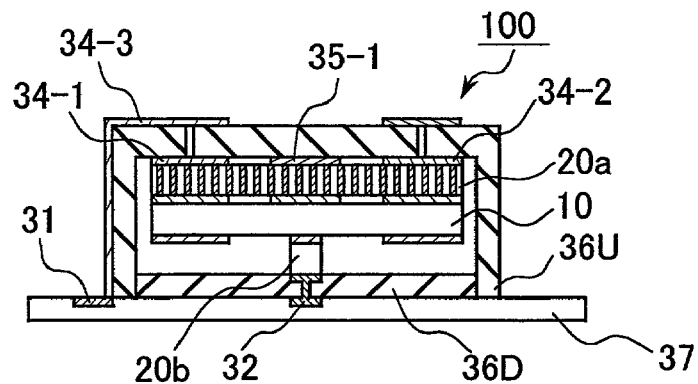
FIG. 4B is a cross-sectional view of the piezoelectric transformer unit 100 taken along the line A–A' in FIG. 4A and seen in the direction of the arrow.
Figure 4C:
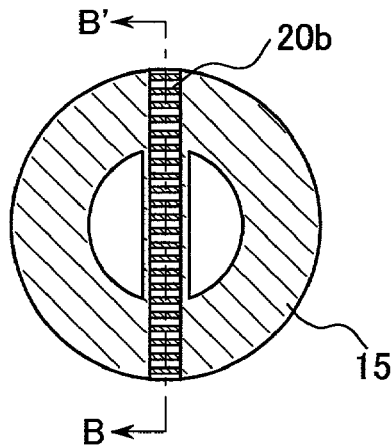
FIG. 4C is a plan view showing the arrangement of the piezoelectric transformer 10 and the conductive elastic body 20b in contact with the second principal face thereof
Figure 4D:
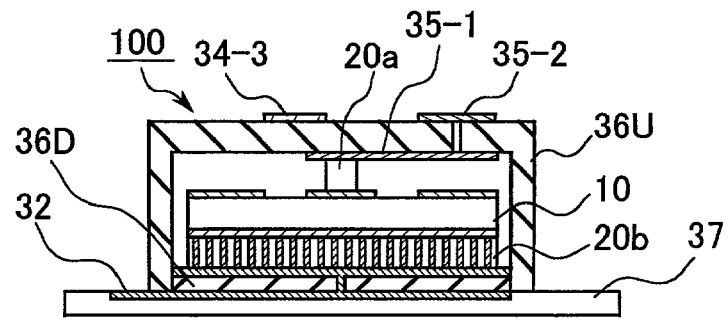
FIG. 4D is a cross-sectional view of the piezoelectric transformer unit 100 taken along the line B–B' in FIG. 4C and seen in the direction of the arrow.

FIG. 4A is a plan view showing the arrangement of the piezoelectric transformer 10 and the conductive elastic body 20a in contact with the first principal face thereof. FIG. 4B is a cross-sectional view of the piezoelectric transformer unit 100 taken along the line A–A' in FIG. 4A and seen in the direction of the arrow. FIG. 4C is a plan view showing the arrangement of the piezoelectric transformer 10 and the conductive elastic body 20b in contact with the second principal face thereof. FIG. 4D is a cross-sectional view of the piezoelectric transformer unit 100 taken along the line B–B' in FIG. 4C and seen in the direction of the arrow.

Here, the upper casing 36U and the lower casing 36D (hereinafter, they also may be referred to collectively as casing 36) are made of an insulating material with little elasticity, and in the present embodiment are formed by PBT (polybutylene terephthalate) resin. Also, the conductive elastic bodies 20a and 20b maintain a space of not more than 1 mm between the piezoelectric transformer 10 and the casing 36. The external dimensions of the piezoelectric transformer unit formed as above are 11.0×11.0×2.0 mm.

The piezoelectric transformer unit of this embodiment has the following advantages over a conventional support structure achieved by metal sheets or conductive rubber or the like provided in several locations in accordance with the number of electrodes.

(1) Support and electrical contact can be performed with conductive elastic bodies.

(2) The casing electrodes and the piezoelectric transformer electrodes are brought into surface contact via the conductive elastic bodies so that the piezoelectric transformer can be stabilized against external impact.

(3) Since support is performed by conductive elastic bodies that have a small elasticity Q, there is little production variation.

(4) The upper casing can prevent the piezoelectric transformer from separating from the unit due to external impact and also holds it stable.

The various properties of the piezoelectric transformer unit with these advantages then were measured.

First, the conversion efficiency of the piezoelectric transformer was measured, with the result that equal efficiency up to 1W output is obtained as when measurement is carried out using lead wires in a state where no stress is applied to the element (in a state where no pressure is applied). Thus, it was possible to confirm that the electrical connections of the present embodiment cause little vibration hindrance.

Next, for the heat generation property, there was a 0.1% or less drop in output power at a temperature rise of 15° C. compared to the case where lead wires were used.

An impact test against external impact showed that the casing 36 and the space between the piezoelectric transformer 10 and the casing 36 were able to protect the piezoelectric transformer 10 from external impact and maintain a good state of contact at that time. However, it was found that when the space between the piezoelectric transformer 10 and the casing 36 was made wider than 1 mm, stress is more easily applied to the contact portions of the piezoelectric transformer 10 and the electrodes, leading to problems such as the element cracking or displacement.

Of course, no audible sound due to vibration could be confirmed when the piezoelectric transformer unit of this embodiment was used.

Figure 5:
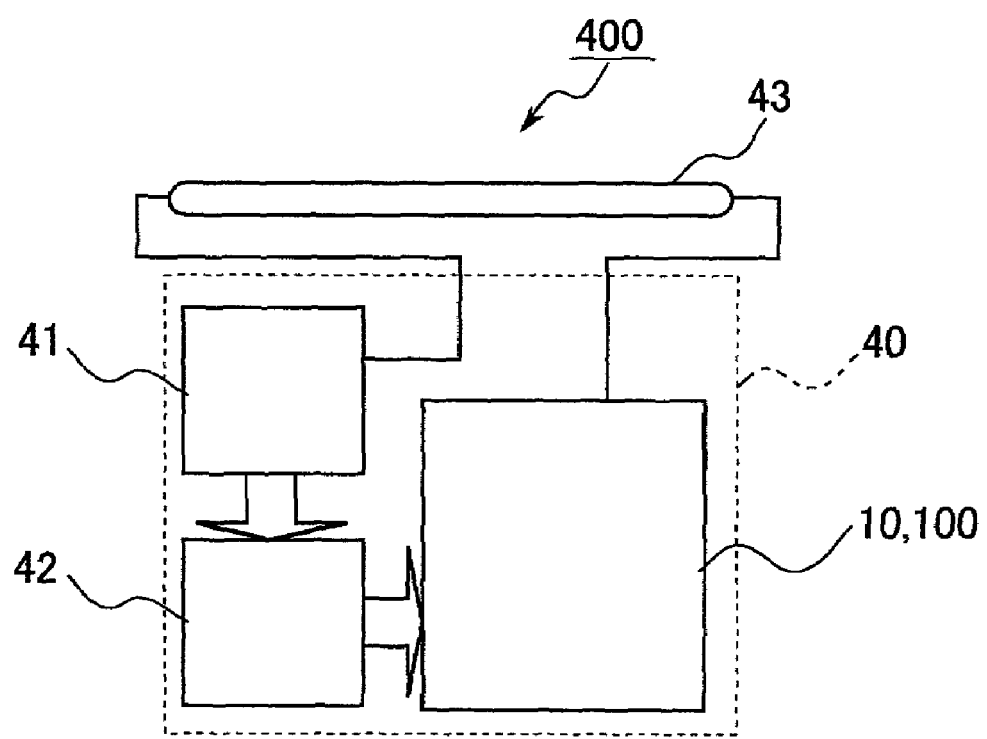
FIG. 5 is a block diagram schematically showing an example of the configuration of a light emission control device 400 for controlling light emitted by a cold cathode tube 43 with an inverter circuit 40 in which the piezoelectric transformer 10 or the piezoelectric transformer unit 100 is installed.
Figure 6:
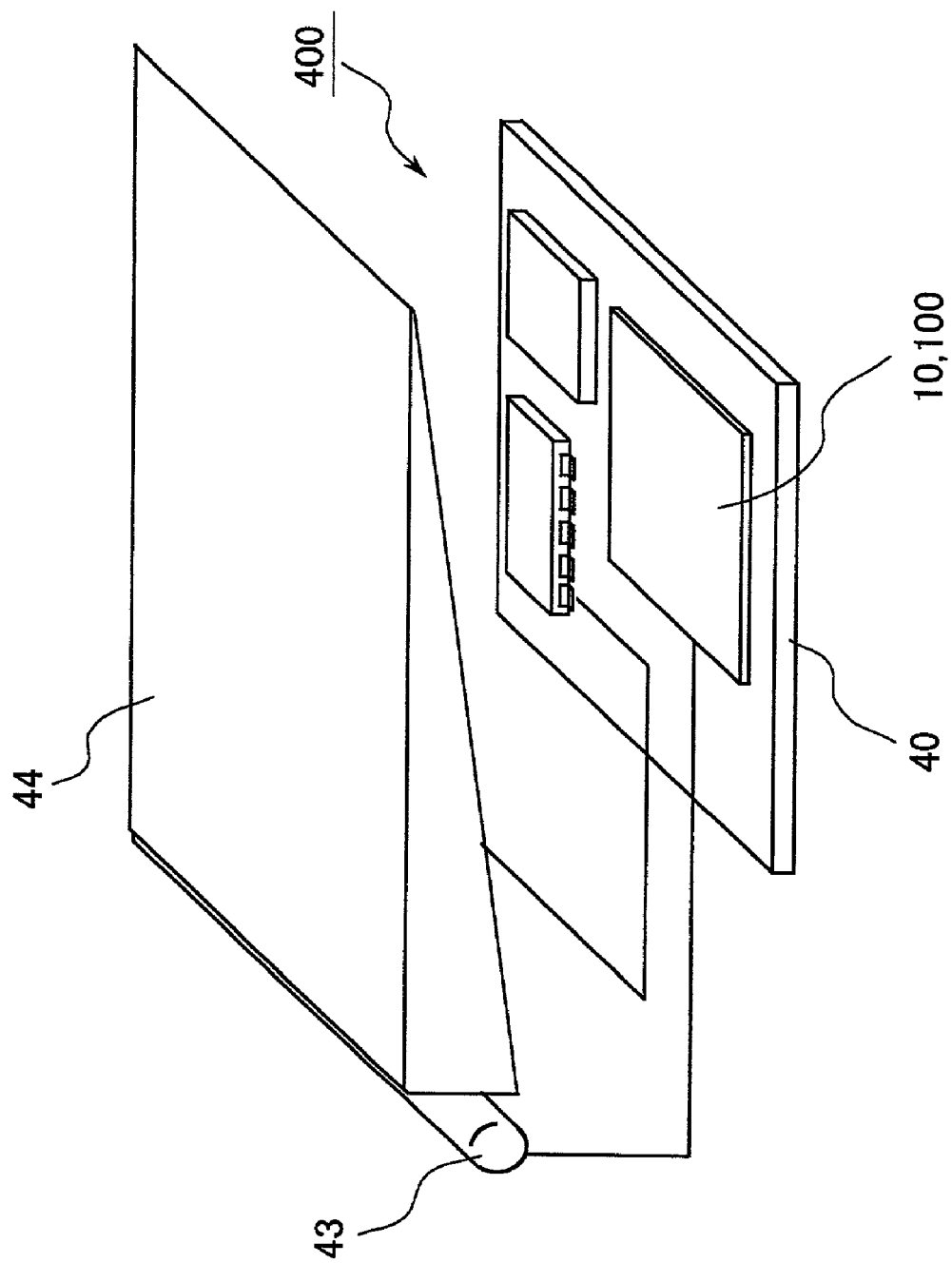
FIG. 6 is a perspective view showing the structure of the light emission control device 400 including a light-guiding plate 44.

FIG. 5 is a block diagram schematically showing an example of the configuration of a light emission control device 400 for controlling light emitted by a cold cathode tube 43 by an inverter circuit 40 in which the piezoelectric transformer 10 or the piezoelectric transformer unit 100 of the present embodiment is installed. FIG. 6 is a perspective view showing the structure of the light emission control device 400 including a light-guiding plate 44.

In FIG. 5, a control portion 41 of the inverter circuit 40 controls the frequency or the voltage of the piezoelectric transformer 10 or the piezoelectric transformer unit 100 to control the brightness of the light emitted by the cold cathode tube 43 via a drive portion 42 based on the voltage or the current, for example, of the cold cathode tube 43.

Using the piezoelectric transformer 10 or the piezoelectric transformer unit 100 of the present embodiment permits a thinner piezoelectric transformer than that of a conventional structure, and by extension, the inverter circuit 40 also can be made thinner. With the light emission control device 400 employing the inverter circuit 40 according to the present embodiment, the inverter circuit 40 can be disposed on the rear surface of the light-guiding plate 44, and therefore the light emission control device 400 can be made smaller.

Figure 7:
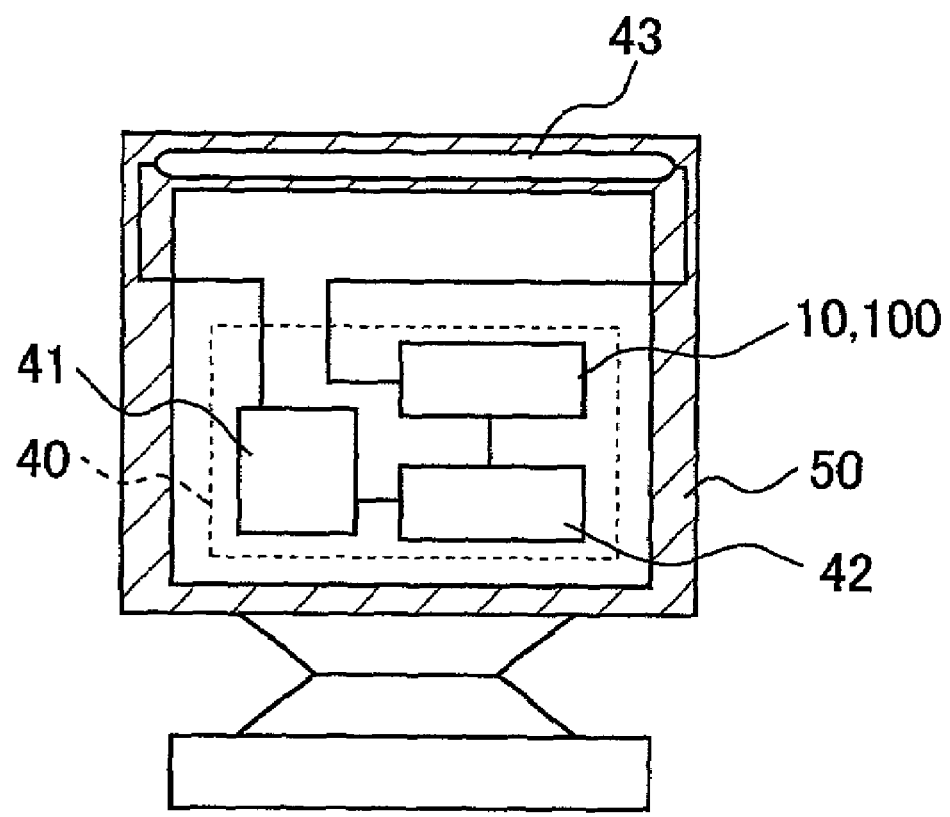
FIG. 7 is a schematic showing a liquid crystal display in which the light emission control device 400 of FIGS. 5 and 6 is employed as the backlight.

FIG. 7 schematically shows the configuration of a liquid crystal display device (hereinafter, described as a liquid crystal display) in which the light emission control device 400 of FIGS. 5 and 6 is employed as the backlight. In FIG. 7, the inverter circuit 40 is disposed on the rear side of the liquid crystal display 50 so that the space conventionally required for disposing the inverter circuit 40 outside the liquid crystal panel is obviated and the liquid crystal display 50 can be provided with a narrower profile. In this case, the inverter circuit 40 is disposed in the space at the rear face of the lightguiding plate 44 so that it does not hamper the liquid crystal display 50 from being made thinner.

Figure 8A:
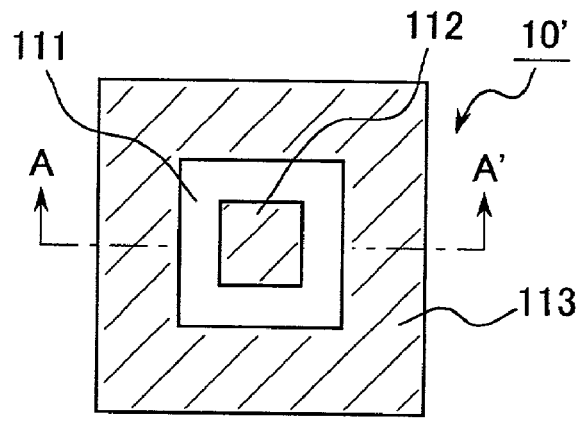
FIG. 8A is a plan view of the first principal face in the thickness direction showing another structure of the piezoelectric transformer according to the first embodiment of the present invention.
Figure 8B:
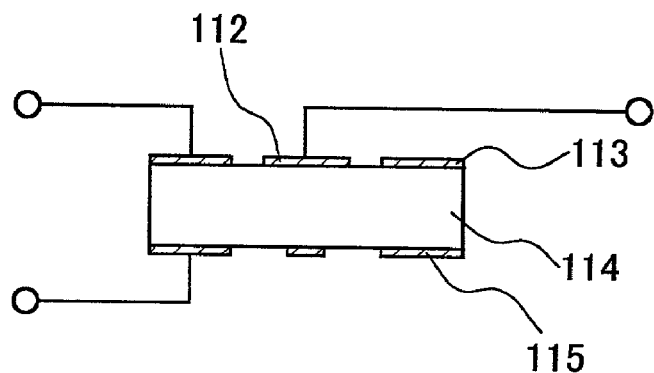
FIG. 8B is a cross-sectional view taken along the line A–A' in FIG. 8A.
Figure 8B:
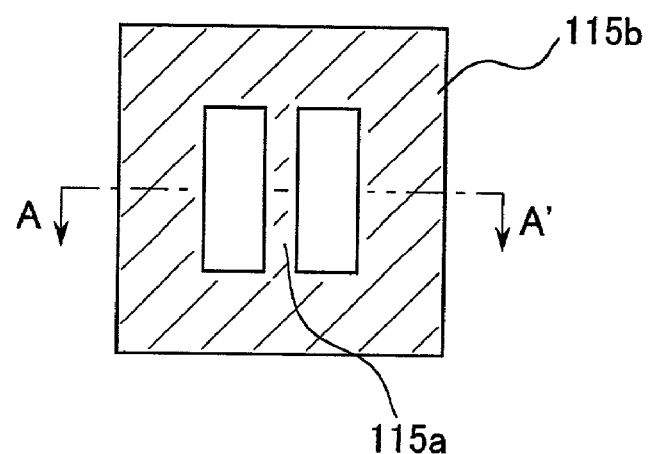

It should be noted that in this embodiment the piezoelectric transformer was made of a circular plate piezoelectric body, but as shown in FIGS. 8A, 8B, and 8C, a piezoelectric transformer 10' also can be made with a rectangular plate substantially equal in length and width. This has for example the advantages that production variation is kept down and that the piezoelectric transformer can be manufactured easily. In FIGS. 8A, 8B, and 8C, elements with the same functions as those in FIG. 1 are assigned numerals 100 greater than those of their counterparts in FIG. 1 and their further explanation has been omitted.

Second Embodiment

Figure 9A:
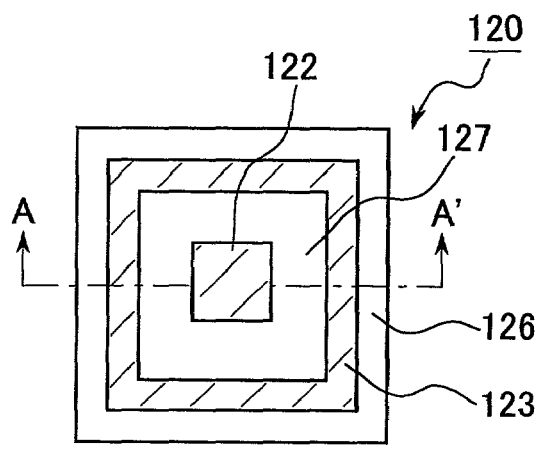
FIG. 9A is a plan view of the first principal face in the thickness direction showing the structure of the piezoelectric transformer according to the second embodiment of the present invention.
Figure 9B:
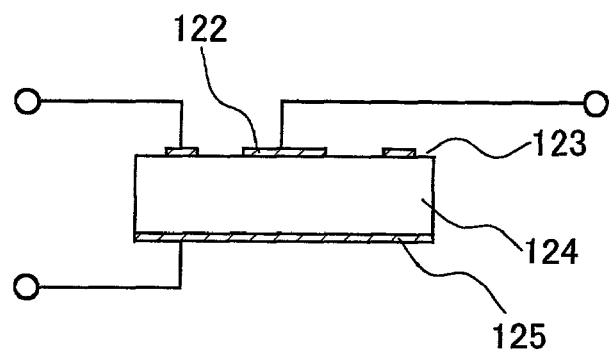
FIG. 9B is a cross-sectional view taken along the line A–A' in FIG. 9A.
Figure 9C:
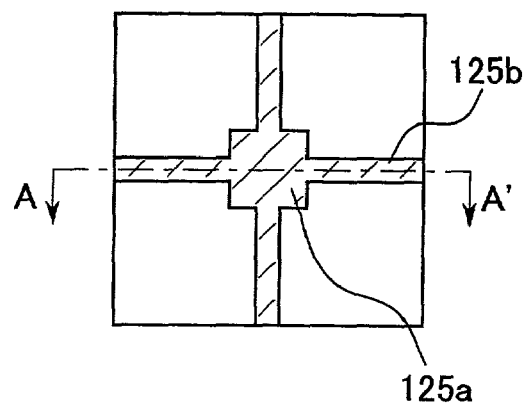
FIG. 9C is a plan view of the second principal face in the thickness direction showing the structure of the piezoelectric transformer according to the second embodiment of the present invention.

FIG. 9A is a plan view showing the structure of the first principal face in the thickness direction of the piezoelectric transformer according to a second embodiment of the present invention. FIG. 9B is a cross-sectional view taken along the line A–A' in FIG. 9A. FIG. 9C is a plan view showing the structure of the second principal face in the thickness direction of the piezoelectric transformer according to a second embodiment of the present invention.

In FIGS. 9A, 9B, and 9C, a piezoelectric transformer 120 is made of a piezoelectric plate 124 polarized entirely in the thickness direction and having a rectangular plate shape substantially equal in length and width, an electrode 122 (first electrode portion) formed in the center on the first principal face in the thickness direction of the piezoelectric plate 124, an electrode 123 (second electrode portion) enclosing the electrode 122 and formed to the inside of a first insulating region 126 provided at the edge portion of the first principal face, and separated from the electrode 122 by a second insulating region 127, an electrode section 125a (third electrode portion) formed on the second principal face in the thickness direction of the piezoelectric plate 124 in a region in opposition to the electrode 122 and with an area substantially equal to that of the electrode 122, and an electrode section 125b (fourth electrode portion) formed on the second principal face integrally with the electrode section 125a and extending from the electrode section 125a to each edge portion along the center lines of the four edges, and which is for adjusting the capacitance of the electrostatic capacitor formed between it and the electrode 123. Here, the electrode sections 125a and 125b are formed in one piece as the common electrode 125 of the primary side and the secondary side.

The low impedance portion is made of the portion formed by the electrode 122 and the electrode section 125a in the thickness direction of the piezoelectric plate, and the high impedance portion is made of the portion formed by the electrode 123 and the electrode section 125b in the thickness direction of the piezoelectric plate.

The piezoelectric transformer 120 is made of a piezoelectric material such as PZT, and voltage applied across the primary side electrodes 122 and 125 is stepped up proportionally so that a high voltage can be output from the secondary side electrode 123.

The present embodiment differs from the first embodiment in two aspects: firstly, the primary side electrodes 122 and 125a are formed near the center of the piezoelectric plate 124, which is a rectangular plate with substantially equal length and width, and secondly, the first insulating region 126 is provided on the first principal face of the piezoelectric plate 124 and insulating regions where electrodes are not formed are provided at the four corners on the second principal face. The first difference is advantageous in vibrating the piezoelectric plate 124, and the second difference, in a case where the piezoelectric transformer 120 is employed for stepping up voltage, makes it possible to ensure safety with respect to the high voltage that is output from the secondary side electrodes 123 and 125 constituting the high impedance portion.

An expanding vibration is employed on the primary and secondary sides in the piezoelectric transformer 120 configured as above, as is the case in the first embodiment. Consequently, the piezoelectric transformer 120 of the present embodiment operates in the same way as that of the first embodiment.

Additionally, the piezoelectric transformer 120 shown in FIGS. 9A, 9B, and 9C can be configured as a piezoelectric transformer unit, as in the first embodiment.

An inverter circuit configured using the piezoelectric transformer or the piezoelectric transformer unit of this embodiment can have a thin profile. As a result a backlight serving as a light emission control device can be made small as in the first embodiment.

Moreover, using the backlight of this embodiment in a liquid crystal display makes it possible to narrow the width of the liquid crystal display. In this case, the inverter circuit similarly is disposed at the rear face of the light-guiding plate so that it does not interfere with providing the liquid crystal display with a thin profile.

Third Embodiment

Figure 10A:
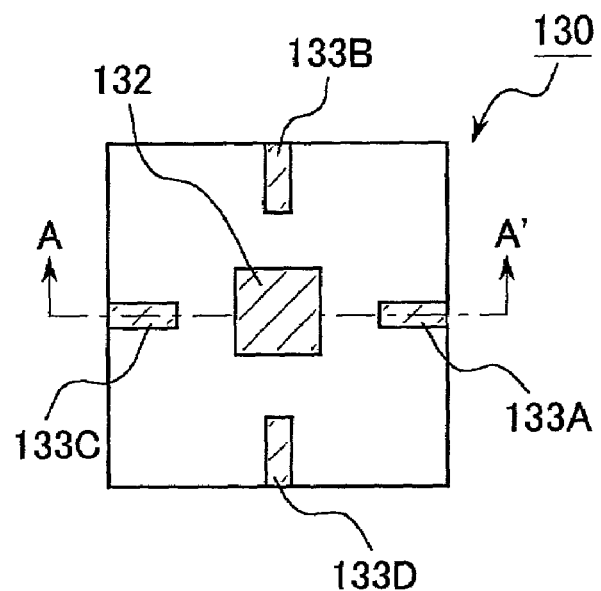
FIG. 10A is a plan view of the first principal face in the thickness direction showing the structure of the piezoelectric transformer according to the third embodiment of the present invention.
Figure 10B:
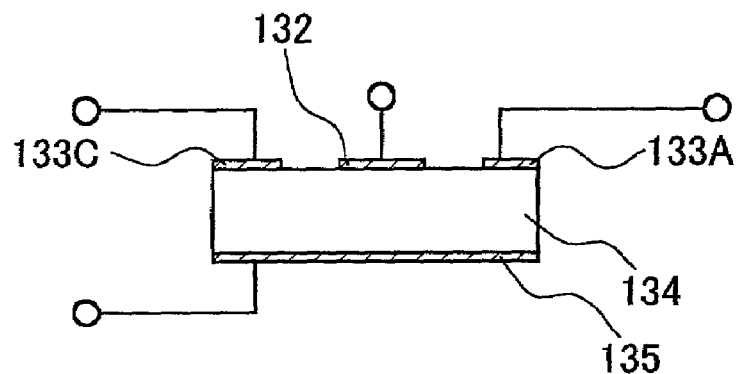
FIG. 10B is a cross-sectional view taken along the line A–A' in FIG. 10A.
Figure 10C:
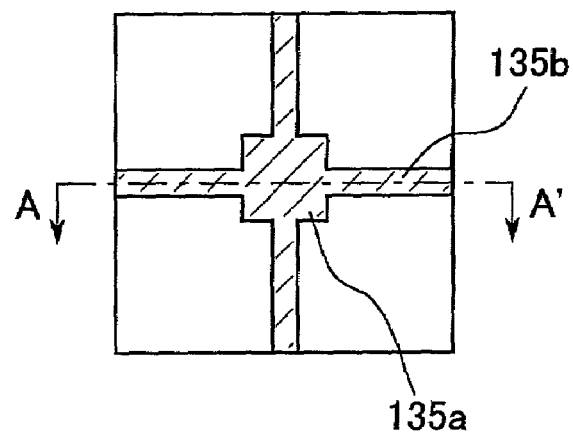
FIG. 10C is a plan view of the second principal face in the thickness direction showing the structure of the piezoelectric transformer according to the third embodiment of the present invention.

FIG. 10A is a plan view showing the structure of the first principal face in the thickness direction of the piezoelectric transformer according to the third embodiment of the present invention. FIG. 10B is a cross-sectional view taken along the line A–A' in FIG. 10A. FIG. 10C is a plan view showing the structure of the second principal face in the thickness direction of the piezoelectric transformer according to the third embodiment of the present invention.

In FIGS. 10A, 10B, and 10C, a piezoelectric transformer 130 is made of a piezoelectric plate 134 polarized entirely in the thickness direction and having a rectangular plate shape substantially equal in length and width, an electrode 132 (first electrode portion) formed in the center on the first principal face in the thickness direction of the piezoelectric plate 134 and geometrically similar to the piezoelectric plate 134, four electrodes 133A, 133B, 133C, and 133D (second electrode portion) each formed on the first principal face in the middle portion of the four edges, an electrode section 135a (third electrode portion) formed on the second principal face in the thickness direction of the piezoelectric plate in a region in opposition to the electrode 132 and with an area substantially equal to that of the electrode 132, and an electrode section 135b (fourth electrode portion) formed on the second principal face integrally with the electrode section 135a and extending from the electrode section 135a to each edge along the center lines of the four edges, and which is for adjusting the capacitance of the electrostatic capacitor formed between it and the electrodes 133A, 133B, 133C, and 133D. Here, the electrode sections 135a and 135b are formed in one piece as a common electrode 135 of the primary side and the secondary side.

The low impedance portion is made of the section formed by the electrode 132 and the electrode section 135a in the thickness direction of the piezoelectric plate 134, and the high impedance portion is made of the section formed by the electrodes 133A, 133B, 133C, and 133D and the electrode section 135b in the thickness direction of the piezoelectric plate 134.

The piezoelectric transformer 130 is made of a piezoelectric material, such as PZT, and voltage applied across the primary side electrodes 132 and 135a is stepped up proportionally so that a high voltage can be output from the secondary side electrodes 133A, 133B, 133C, and 133D.

The present embodiment differs from the first embodiment in that the primary side electrodes 132 and 135a are formed near the center of a rectangular plate substantially equal in length and width (first difference), and differs from the second embodiment in that four electrodes 133A, 133B, 133C, and 133D are formed in the middle of each of the four edge portions, with the remaining area serving as an insulating region (second difference). The first difference is advantageous for letting the piezoelectric plate 134 vibrate, and the second difference, in a case where the piezoelectric transformer 130 is used to step up voltage, makes it possible to take the output voltage from the electrode at the best position among the four electrodes 133A, 133B, 133C, and 133D in accordance with the arrangement of the load and the external circuit.

An expanding vibration is employed on the primary and secondary sides in the piezoelectric transformer 130 configured as above, as is the case in the first embodiment. Consequently, the piezoelectric transformer 130 of the present embodiment operates in the same way as that of the first embodiment.

An inverter circuit configured using the piezoelectric transformer 130 of this embodiment can have a thin profile. As a result a backlight serving as a light emission control device can be made small as in the first embodiment.

Moreover, using the backlight of this embodiment in a liquid crystal display makes it possible to narrow the width of the liquid crystal display. In this case, the inverter circuit similarly is disposed at the rear face of the light-guiding plate so that it does not interfere with providing the liquid crystal display with a thin profile.

Fourth Embodiment

Figure 11A:
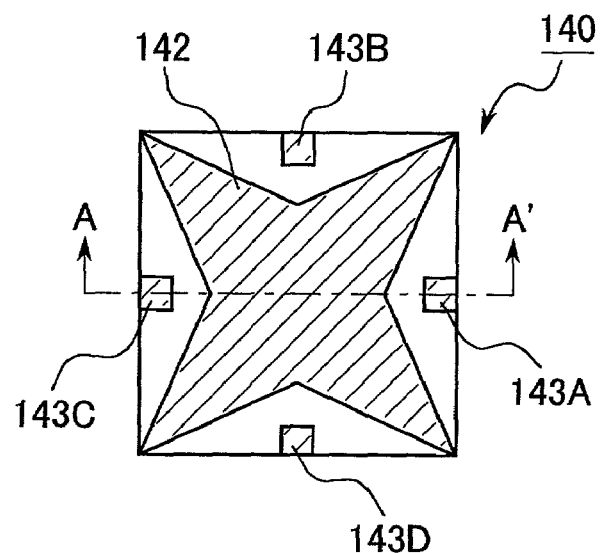
FIG. 11A is a plan view of the first principal face in the thickness direction showing the structure of the piezoelectric transformer according to the fourth embodiment of the present invention.
Figure 11B:
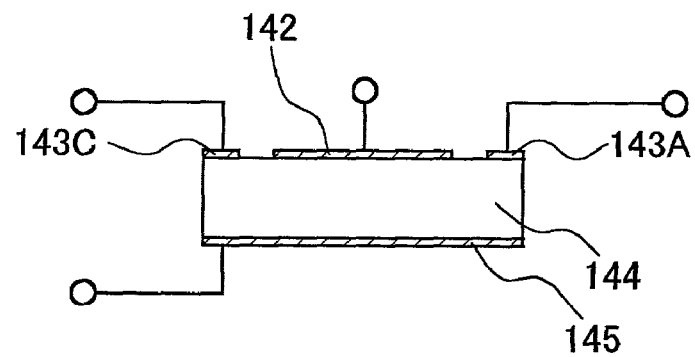
FIG. 11B is a cross-sectional view taken along the line A–A' in FIG. 11A.
Figure 11C:
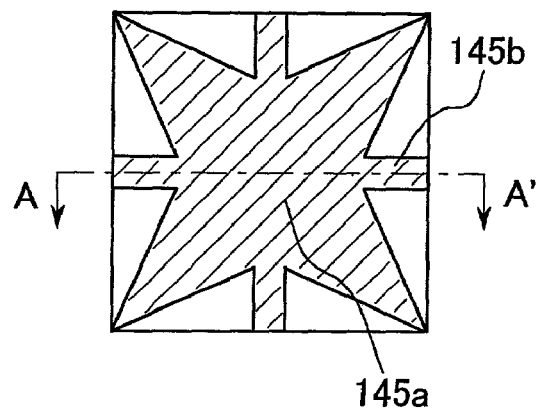
FIG. 11C is a plan view of the second principal face in the thickness direction showing the structure of the piezoelectric transformer according to the fourth embodiment of the present invention.
Figure 12A:
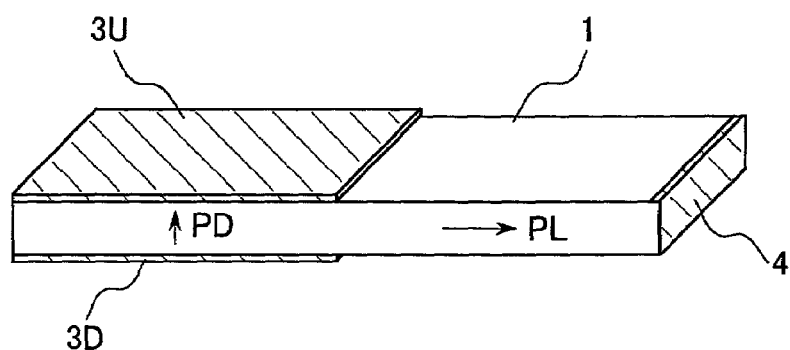
FIG. 12A is an outside perspective view showing the structure of a conventional Rosen-type piezoelectric transformer.
Figure 12B:
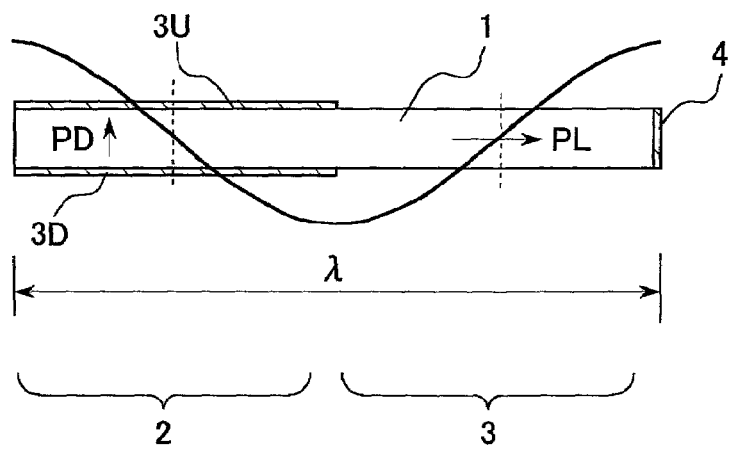
FIG. 12B is a cross-sectional view in the length direction of the piezoelectric transformer shown in FIG. 12A.

FIG. 11A is a plan view showing the structure of the first principal face in the thickness direction of the piezoelectric transformer according to the fourth embodiment of the present invention. FIG. 11B is a cross-sectional view taken along the line A–A' in FIG. 11A. FIG. 11C is a plan view showing the structure of the second principal face in the thickness direction of the piezoelectric transformer according to the fourth embodiment of the present invention.

In FIGS. 11A, 11B, and 11C, a piezoelectric transformer 140 is made of a piezoelectric plate 144 polarized entirely in the thickness direction and having a rectangular plate shape substantially equal in length and width, an electrode 142 (first electrode portion) formed on the first principal face of the piezoelectric plate 134 in the thickness direction and having linear symmetry about the diagonals, electrodes 143A, 143B, 143C, and 143D (second electrode portion) each formed on the first principal face in the middle portion of the four edges, an electrode section 145a (third electrode portion) formed on the second principal face in the thickness direction of the piezoelectric plate 144 in a region opposing the electrode 142 and having an area substantially equal to that of the electrode 142, and an electrode section 145b (fourth electrode portion) formed on the second principal face integrally with the electrode section 145a and extending from the electrode section 145a to each edge along the center lines of the four edges, and which is for adjusting the capacitance of the electrostatic capacitor formed between it and the electrodes 143A, 143B, 143C, and 143D. Here, the electrode sections 145a and 145b are formed in one piece as a common electrode 145 of the primary side and the secondary side.

The low impedance portion is made of the section formed by the electrode 142 and the electrode section 145a in the thickness direction of the piezoelectric plate 144, and the high impedance portion is made of the section formed by the electrodes 143A, 143B, 143C, and 143D and the electrode section 145b in the thickness direction of the piezoelectric plate 144.

The piezoelectric transformer 140 is made of a piezoelectric material, such as PZT, and voltage applied across the primary side electrodes 142 and 145a is stepped up proportionally so that a high voltage can be output from the secondary side electrodes 143A, 143B, 143C, and 143D.

This embodiment differs from the third embodiment in the shape of the primary side electrodes 142 and 145a. That is, the advantage of forming the primary side electrodes 142 and 145a with linear symmetry about the diagonals is that this makes it easier to excite a radial vibration of the rectangular plate.

An expanding vibration is employed on the primary and secondary sides in the piezoelectric transformer 140 configured above, as is the case in the first embodiment. Consequently, the piezoelectric transformer 140 of the present embodiment operates in the same way as that of the first embodiment.

An inverter circuit configured using the piezoelectric transformer 140 of this embodiment can have a thin profile. As a result a backlight serving as a light emission control device can be made small as in the first embodiment.

Moreover, using the backlight of this embodiment in a liquid crystal display makes it possible to narrow the width of the liquid crystal display. In this case, the inverter circuit similarly is disposed at the rear face of the light-guiding plate so that it does not interfere with providing the liquid crystal display with a thin profile.

The piezoelectric transformer of the first through fourth embodiments is formed using a piezoelectric material such as PZT, but as long as the material is piezoelectric, it is also possible to use a monocrystalline material such as LiNbO$_3$, to achieve the same properties.

Making the insulating region at least as thick as the piezoelectric plate can prevent increases in the capacitance between the electrodes in the center portion due to unintentional polarization of the insulating region, where electrodes are not formed.

As described above, with the present invention, the secondary side capacitance of the piezoelectric transformer can be changed freely to match the impedance to the load by adjusting the structure of the electrode on the second principal face in the thickness direction of the piezoelectric plate, and therefore the drive efficiency when operating the cold cathode tube serving as the load can be increased.

The effective coupling factor resulting from the electrode structure and the vibration mode can be kept high even if the secondary side capacitance value of the piezoelectric transformer is freely changed. Thus, it is possible to maintain high element efficiency and a small amount of generated heat, and moreover, stress also can be reduced.

Furthermore, the piezoelectric transformer unit of the present invention can be used to make a highly-reliable small scale piezoelectric inverter and enables thinner liquid crystal backlights and liquid crystal display devices with a narrower profile. Accordingly, it has a considerably large practical effect.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description. All changes that come within the meaning and range of equivalency of the claims are intended to be embraced therein.

What is claimed is:

1. A piezoelectric transformer, comprising:
   a piezoelectric plate polarized entirely in a thickness direction;
   a first electrode portion formed in a center portion on a first principal face in the thickness direction of the piezoelectric plate;
   a second electrode portion enclosing the first electrode portion and formed from an interior to an edge on the first principal face, and separated from the first electrode portion by an insulating region;
   a third electrode portion formed on a second principal face in the thickness direction of the piezoelectric plate in a region in opposition to the first electrode portion and the insulating region and facing the first electrode portion with an area smaller than a whole area of the first electrode portion, so as to be suitable for adjusting a capacitance of an electrostatic capacitor formed between the third electrode portion and the first electrode portion; and
   a fourth electrode portion formed integrally with the third electrode portion on the second principal face and having an area substantially equal to that of the second electrode portion, with an insulating region being provided partially between the third electrode and the fourth electrode portion;
   wherein a high impedance portion is made of a portion formed by the first electrode portion and the third electrode portion in the thickness direction of the piezoelectric plate, and a low impedance portion is made of a portion formed by the second electrode portion and the fourth electrode portion in the thickness direction of the piezoelectric plate, and
   the high impedance portion is suitable for adjustment of the impedance in accordance with a load by adjusting a dimension of the third electrode portion.

2. The piezoelectric transformer according to claim 1, wherein the piezoelectric plate is in the shape of a circular disk.

3. The piezoelectric transformer according to claim 1, wherein the piezoelectric plate is in the shape of a rectangular plate substantially equal in length and width.

4. A piezoelectric transformer, comprising:
   a piezoelectric plate polarized entirely in a thickness direction;
   a first electrode portion formed in a center portion on a first principal face in the thickness direction of the piezoelectric plate;
   a second electrode portion enclosing the first electrode portion and formed from an interior to an edge on the first principal face, and separated from the first electrode portion by an insulating region;
   a third electrode portion formed on a second principal face in the thickness direction of the piezoelectric plate in a region in opposition to the first electrode portion and the insulating region, and which is for adjusting a capacitance of an electrostatic capacitor formed between the third electrode portion and the first electrode portion; and
   a fourth electrode portion formed integrally with the third electrode portion on the second principal face and having an area substantially equal to that of the second electrode portion;
   wherein a high impedance portion is made of a portion formed by the first electrode portion and the third electrode portion in the thickness direction of the piezoelectric plate, and a low impedance portion is made of a portion formed by the second electrode portion and the fourth electrode portion in the thickness direction of the piezoelectric plate,
   wherein a space between the first electrode portion and the second electrode portion, which are separated by the insulating region, is equal to or greater than the thickness of the piezoelectric plate.

5. A piezoelectric transformer, comprising:
   a piezoelectric plate polarized entirely in a thickness direction and shaped as a rectangular plate substantially equal in length and width;
   a first electrode portion formed in a center portion on a first principal face in the thickness direction of the piezoelectric plate;
   a second electrode portion enclosing the first electrode portion and formed to the interior of a first insulating region provided at a perimeter portion on the first principal face, and separated from the first electrode portion by a second insulating region;
   a third electrode portion formed on a second principal face in the thickness direction of the piezoelectric plate in a region in opposition to the first electrode portion and having an area substantially equal to that of the first electrode portion; and
   a fourth electrode portion formed integrally with the third electrode portion on the second principal face and extending from the third electrode portion to the perimeter portion along center lines of the four edges with third insulating regions being provided at four corner areas of the second principal face, so as to be suitable for adjusting a capacitance of an electrostatic capacitor formed between the fourth electrode portion and the second electrode portion;
   wherein a low impedance portion is made of a portion formed by the first electrode portion and the third electrode portion in the thickness direction of the piezoelectric plate, and a high impedance portion is made of a portion formed by the second electrode portion and the fourth electrode portion in the thickness direction of the piezoelectric plate, and
   the high impedance portion is suitable for adjustment of the impedance in accordance with a load by adjusting a dimension of the fourth electrode portion.

6. The piezoelectric transformer according to claim 5, wherein the first electrode portion is geometrically similar to the outer dimensions of the piezoelectric plate.

7. A piezoelectric transformer, comprising:
   a piezoelectric plate polarized entirely in a thickness direction and shaped as a rectangular plate substantially equal in length and width;
   a first electrode portion formed in liner symmetry about the diagonals on a first principal face in the thickness direction of the piezoelectric plate;
   a second electrode portion formed in a middle portion of each of four perimeter portions on the first principal face, and separated from the first electrode portion by a second insulating region;

a third electrode portion formed on a second principal face in the thickness direction of the piezoelectric plate in a region in opposition to the first electrode portion and having a shape substantially corresponding to that of the first electrode portion; and a fourth electrode portion formed integrally with the third electrode portion on the second principal face and extending from the third electrode portion to the perimeter portions along the center lines of the four edges with insulating regions being provided at areas between a periphery of the third electrode portion and a periphery of the fourth electrode portion, so as to be is suitable for adjusting a capacitance of an electrostatic capacitor formed between the fourth electrode portion and the second electrode portion;

wherein a low impedance portion is made of a portion formed by the first electrode portion and the third electrode portion in the thickness direction of the piezoelectric plate, and a high impedance portion is made of a portion formed by the second electrode portion and the fourth electrode portion in the thickness direction of the piezoelectric plate, and the high impedance portion is suitable for adjustment of the impedance in accordance with a load by adjusting the dimension of the fourth electrode portion.

8. The piezoelectric transformer according to claim 7, wherein the first electrode portion is geometrically similar to the outer dimensions of the piezoelectric plate.

9. A piezoelectric transformer unit, comprising:

a piezoelectric transformer provided with a piezoelectric plate polarized entirely in a thickness direction, a first electrode portion formed in a center portion on a first principal face in the thickness direction of the piezoelectric plate, a second electrode portion enclosing the first electrode portion and formed from an interior to an edge on the first principal face, and separated front the first electrode portion by an insulating region, a third electrode portion formed on a second principal face in the thickness direction of the piezoelectric plate in a region in opposition to the first electrode portion and the insulating region, and which is for adjusting a capacitance of an electrostatic capacitor formed between the third electrode portion and the first electrode portion, and a fourth electrode portion formed integrally with the third electrode portion on the second principal face and having an area substantially equal to that of the second electrode portion, wherein a high impedance portion is made of a portion formed by the first electrode portion and the third electrode portion in the thickness direction of the piezoelectric plate, and a low impedance portion is made of a portion formed by the second electrode portion and the fourth electrode portion in the thickness direction of the piezoelectric plate;

a conductive elastic body made by alternately laminating conducting layers and insulating layers and for supporting the piezoelectric transformer and electrically connecting to the electrode portions of the piezoelectric transformer; and a casing for accommodating and supporting the piezoelectric transformer and the conductive elastic body as well as electrically connecting the electrode portions of the piezoelectric transformer to outside portions via the conductive elastic body.

10. The piezoelectric transformer unit according to claim 9, wherein the conductive elastic body comprises:

a first conductive elastic body in contact with the first principal face of the piezoelectric transformer and having a length substantially equal to the length of the piezoelectric transformer; and a second conductive elastic body in contact with the second principal face of the piezoelectric transformer and having a length substantially equal to the width of the piezoelectric transformer;

wherein the first conductive elastic body and the second conductive elastic body are perpendicular to one another and sandwich the piezoelectric transformer.

11. A piezoelectric transformer unit, comprising:

a piezoelectric transformer provided with a piezoelectric plate polarized entirely in a thickness direction and shaped as a rectangular plate substantially equal in length and width, a first electrode portion formed in a center portion on a first principal face in the thickness direction of the piezoelectric plate, a second electrode portion enclosing the first electrode portion and formed to the interior of a first insulating region provided at the perimeter portion on the first principal face, and separated from the first electrode portion by a second insulating region, a third electrode portion formed on a second principal face in the thickness direction of the piezoelectric plate in a region in opposition to the first electrode portion and having an area substantially equal to that of the first electrode portion, and a fourth electrode portion formed integrally with the third electrode portion on the second principal face and extending from the third electrode portion to the perimeter portion along the center lines of the four edges, and which is for adjusting a capacitance of an electrostatic capacitor formed between the fourth electrode portion and the second electrode portion, wherein a low impedance portion is made of a portion formed by the first electrode portion and the third electrode portion in the thickness direction of the piezoelectric plate, and a high impedance portion is made of a portion formed by the second electrode portion and the fourth electrode portion in the thickness direction of the piezoelectric plate;

a conductive elastic body made by alternately laminating conducting layers and insulating layers and for supporting the piezoelectric transformer and electrically connecting to the electrode portions of the piezoelectric transformer; and a casing for accommodating and supporting the piezoelectric transformer and the conductive elastic body as well as electrically connecting the electrode portions of the piezoelectric transformer to outside portions via the conductive elastic body.

12. The piezoelectric transformer unit according to claim 11, wherein the conductive elastic body comprises a first conductive elastic body in contact with the first principal face of the piezoelectric transformer and having a length substantially equal to the length of the piezoelectric transformer; and a second conductive elastic body in contact with the second principal face of the piezoelectric transformer and having a length substantially equal to the width of the piezoelectric transformer;

wherein the first conductive elastic body and the second conductive elastic body are perpendicular to one another and sandwich the piezoelectric transformer.

13. An inverter circuit, comprising:
a piezoelectric transformer provided with a piezoelectric plate polarized entirely in a thickness direction and shaped as a rectangular plate substantially equal in length and width, a first electrode portion formed in linear symmetry about the diagonals on a first principal face in the thickness direction of the piezoelectric plate, a second electrode portion formed in a middle portion of each of four perimeter portions on the first principal face, a third electrode portion formed on a second principal face in the thickness direction of the piezoelectric plate in a region in opposition to the first electrode portion and having an area substantially equal to that of the first electrode portion, and a fourth electrode portion formed integrally with the third electrode portion on the second principal face and extending from the third electrode portion to the perimeter portions along the center lines of the four edges, and which is for adjusting a capacitance of an electrostatic capacitor formed between the fourth electrode portion and the second electrode portion, wherein a low impedance portion is made of a portion formed by the first electrode portion and the third electrode portion in the thickness direction of the piezoelectric plate, and a high impedance portion is made of a portion formed by the second electrode portion and the fourth electrode portion in the thickness direction of the piezoelectric plate; and
a drive control circuit for the piezoelectric transformer.

14. An inverter circuit, comprising:
a piezoelectric transformer unit having a piezoelectric transformer provided with a piezoelectric plate polarized entirely in a thickness direction, a first electrode portion formed in a center portion on a first principal face in the thickness direction of the piezoelectric plate, a second electrode portion enclosing the first electrode portion and formed from an interior to an edge on the first principal face, and separated from the first electrode portion by an insulating region, a third electrode portion formed on a second principal face in the thickness direction of the piezoelectric plate in a region in opposition to the first electrode portion and the insulating region, and which is for adjusting a capacitance of an electrostatic capacitor formed between the third electrode portion and the first electrode portion, and a fourth electrode portion formed integrally with the third electrode portion on the second principal face and having an area substantially equal to that of the second electrode portion, wherein a high impedance portion is made of a portion formed by the first electrode portion and the third electrode portion in the thickness direction of the piezoelectric plate, and a low impedance portion is made of a portion formed by the second electrode portion and the fourth electrode portion in the thickness direction of the piezoelectric plate; a conductive elastic body made by alternately laminating conducting layers and insulating layers and for supporting the piezoelectric transformer and electrically connecting to the electrode portions of the piezoelectric transformer; and a casing for accommodating and supporting the piezoelectric transformer and the conductive elastic body as well as electrically connecting the electrode portions of the piezoelectric transformer to outside portions via the conductive elastic body; and
a drive control circuit for the piezoelectric transformer unit.

15. An inverter circuit, comprising:
a piezoelectric transformer unit having a piezoelectric transformer provided with a piezoelectric plate polarized entirely in a thickness direction and shaped as a rectangular plate substantially equal in length and width, a first electrode portion formed in a center portion on a first principal face in the thickness direction of the piezoelectric plate, a second electrode portion enclosing the first electrode portion and formed to the interior of a first insulating region provided at the perimeter portion on the first principal face, and separated from the first electrode portion by a second insulating region, a third electrode portion formed on a second principal face in the thickness direction of the piezoelectric plate in a region in opposition to the first electrode portion and having an area substantially equal to that of the first electrode portion, and a fourth electrode portion formed integrally with the third electrode portion on the second principal face and extending from the third electrode portion to the perimeter portion along the center lines of the four edges, and which is for adjusting a capacitance of an electrostatic capacitor formed between the fourth electrode portion and the second electrode portion, wherein a low impedance portion is made of a portion formed by the first electrode portion and the third electrode portion in the thickness direction of the piezoelectric plate, and a high impedance portion is made of a portion formed by the second electrode portion and the fourth electrode portion in the thickness direction of the piezoelectric plate; a conductive elastic body made by alternately laminating conducting layers and insulating layers and for supporting the piezoelectric transformer and electrically connecting to the electrode portions of the piezoelectric transformer; and a casing for accommodating and supporting the piezoelectric transformer and the conductive elastic body as well as electrically connecting the electrode portions of the piezoelectric transformer to outside portions via the conductive elastic body; and
a drive control circuit for the piezoelectric transformer unit.

16. A light emission control device, comprising:
an inverter circuit having a piezoelectric transformer provided with a piezoelectric plate polarized entirely in a thickness direction and shaped as a rectangular plate substantially equal in length and width, a first electrode portion formed in linear symmetry about the diagonals on a first principal face in the thickness direction of the piezoelectric plate, a second electrode portion formed in a middle portion of each of four perimeter portions on the first principal face, a third electrode portion formed on a second principal face in the thickness direction of the piezoelectric plate in a region in opposition to the first electrode portion and having an area substantially equal to that of the first electrode portion, and a fourth electrode portion formed integrally with the third electrode portion on the second principal face and extending from the third electrode portion to the perimeter portions along the center lines of the four edges, and which is for adjusting a capacitance of an electrostatic capacitor farmed between the fourth electrode portion and the second electrode portion, wherein a low impedance portion is made of a portion formed by the first electrode portion and the third electrode portion in the thickness direction of the piezoelectric plate, and a high impedance portion is made of a portion formed by the second electrode portion and the fourth electrode portion in the thickness direction of the piezoelectric plate; and a drive control circuit for the piezoelectric transformer; and
a cold cathode tube serving as a load of the piezoelectric transformer.

17. A light emission control device, comprising:
an inverter circuit having a piezoelectric transformer unit with a piezoelectric transformer provided with a piezoelectric plate polarized entirely in a thickness direction, a first electrode portion formed in a center portion on a first principal face in the thickness direction of the piezoelectric plate, a second electrode portion enclosing the first electrode portion and formed from an interior to an edge on the first principal face, and separated from the first electrode portion by an insulating region, a third electrode portion formed on a second principal face in the thickness direction of the piezoelectric plate in a region in opposition to the first electrode portion and the insulating region, and which is for adjusting a capacitance of an electrostatic capacitor formed between the third electrode portion and the first electrode portion, and a fourth electrode portion formed integrally with the third electrode portion on the second principal face and having an area substantially equal to that of the second electrode portion, wherein a high impedance portion is made of a portion formed by the first electrode portion and the third electrode portion in the thickness direction of the piezoelectric plate, and a low impedance portion is made of a portion formed by the second electrode portion and the fourth electrode portion in the thickness direction of the piezoelectric plate; a conductive elastic body made by alternately laminating conducting layers and insulating layers, and which is for supporting the piezoelectric transformer and electrically connecting to the electrode portions of the piezoelectric transformer; and a casing for accommodating and supporting the piezoelectric transformer and the conductive elastic body as well as electrically connecting the electrode portions of the piezoelectric transformer to outside portions via the conductive elastic body; and a drive control circuit for the piezoelectric transformer unit; and
a cold cathode tube serving as a load of the piezoelectric transformer.

18. A light emission control device, comprising:
an inverter circuit having a piezoelectric transformer unit with a piezoelectric transformer provided with a piezoelectric plate polarized entirely in a thickness direction and shaped as a rectangular plate substantially equal in length and width, a first electrode portion formed in a center portion on a first principal face in the thickness direction of the piezoelectric plate, a second electrode portion enclosing the first electrode portion and formed to the interior of a first insulating region provided at the perimeter portion on the first principal face, and separated from the first electrode portion by a second insulating region, a third electrode portion formed on a second principal face in the thickness direction of the piezoelectric plate in a region in opposition to the first electrode portion and having an area substantially equal to that of the first electrode portion, and a fourth electrode portion formed integrally with the third electrode portion on the second principal face and extending from the third electrode portion to the perimeter portion along the center lines of the four edges, and which is for adjusting a capacitance of an electrostatic capacitor formed between the fourth electrode portion and the second electrode portion, wherein a low impedance portion is made of a portion formed by the first electrode portion and the third electrode portion in the thickness direction of the piezoelectric plate, and a high impedance portion is made of a portion formed by the second electrode portion and the fourth electrode portion in the thickness direction of the piezoelectric plate; a conductive elastic body made by alternately laminating conducting layers and insulating layers and for supporting the piezoelectric transformer and electrically connecting to the electrode portions of the piezoelectric transformer; and a casing for accommodating and supporting the piezoelectric transformer and the conductive elastic body as well as electrically connecting the electrode portions of the piezoelectric transformer to outside portions via the conductive elastic body; and a drive control circuit for the piezoelectric transformer unit; and
a cold cathode tube serving as a load of the piezoelectric transformer.

19. A liquid crystal display device, comprising:
a light emission control device having an inverter circuit having a piezoelectric transformer provided with a piezoelectric plate polarized entirely in a thickness direction and shaped as a rectangular plate substantially equal in length and width, a first electrode portion formed in linear symmetry about the diagonals on a first principal face in the thickness direction of the piezoelectric plate, a second electrode portion formed in a middle portion of each of four perimeter portions on the first principal face, a third electrode portion formed on a second principal face in the thickness direction of the piezoelectric plate in a region in opposition to the first electrode portion and having an area substantially equal to that of the first electrode portion, and a fourth electrode portion formed integrally with the third electrode portion on the second principal face and extending from the third electrode portion to the perimeter portions along the center lines of the four edges, and which is for adjusting a capacitance of an electrostatic capacitor formed between the fourth electrode portion and the second electrode portion, wherein a low impedance portion is made of a portion formed by the first electrode portion and the third electrode portion in the thickness direction of the piezoelectric plate, and a high impedance portion is made of a portion formed by the second electrode portion and the fourth electrode portion in the thickness direction of the piezoelectric plate, and a drive control circuit for the piezoelectric transformer; and a cold cathode tube serving as a load of the piezoelectric transformer; and
a liquid crystal panel in which brightness control is performed by the light emission control device.

20. A liquid crystal display device, comprising:
a light emission control device having an inverter circuit having a piezoelectric transformer unit with a piezoelectric transformer provided with a piezoelectric plate polarized entirely in a thickness direction, a first electrode portion formed in a center portion on a first principal face in the thickness direction of the piezoelectric plate, a second electrode portion enclosing the first electrode portion and formed from an interior to an edge on the first principal face, and separated from the first electrode portion by an insulating region, a third electrode portion formed on a second principal face in the thickness direction of the piezoelectric plate in a region in opposition to the first electrode portion and the insulating region, and which is for adjusting a capacitance of an electrostatic capacitor formed between the third electrode portion and the first electrode portion, and a fourth electrode portion formed integrally with the third electrode portion on the second principal face and having an area substantially equal to that of the second electrode portion, wherein a high impedance portion is made of a portion formed by the first electrode portion and the third electrode portion in the thickness direction of the piezoelectric plate, and a low impedance portion is made of a portion formed by the second electrode portion and the fourth electrode portion in the thickness direction of the piezoelectric plate; a conductive elastic body made by alternately laminating conducting layers and insulating layers and for supporting the piezoelectric transformer and electrically connecting to the electrode portions of the piezoelectric transformer; and a casing for accommodating and supporting the piezoelectric transformer and the conductive elastic body as well as electrically connecting the electrode portions of the piezoelectric transformer to outside portions via the conductive elastic body, and a drive control circuit for the piezoelectric transformer unit; and a cold cathode tube serving as a load of the piezoelectric transformer; and a liquid crystal panel in which brightness control is performed by the light emission control device.

21. A liquid crystal display device, comprising:

a light emission control device having an inverter circuit having a piezoelectric transformer unit with a piezoelectric transformer provided with a piezoelectric plate polarized entirely in a thickness direction and shaped as a rectangular plate substantially equal in length and width, a first electrode portion formed in a center portion on a first principal face in the thickness direction of the piezoelectric plate, a second electrode portion enclosing the first electrode portion and formed to the interior of a first insulating region provided at the perimeter portion on the first principal face, and separated from the first electrode portion by a second insulating region, a third electrode portion formed on a second principal face in the thickness direction of the piezoelectric plate in a region in opposition to the first electrode portion and having an area substantially equal to that of the first electrode portion, and a fourth electrode portion formed integrally with the third electrode portion on the second principal face and extending from the third electrode portion to the perimeter portion along the center lines of the four edges, and which is for adjusting a capacitance of an electrostatic capacitor formed between the fourth electrode portion and the second electrode portion, wherein a low impedance portion is made of a portion formed by the first electrode portion and the third electrode portion in the thickness direction of the piezoelectric plate, and a high impedance portion is made of a portion formed by the second electrode portion and the fourth electrode portion in the thickness direction of the piezoelectric plate; a conductive elastic body made by alternately laminating conducting layers and insulating layers and for supporting the piezoelectric transformer and electrically connecting to the electrode portions of the piezoelectric transformer; and a casing for accommodating and supporting the piezoelectric transformer and the conductive elastic body as well as electrically connecting the electrode portions of the piezoelectric transformer to outside portions via the conductive elastic body, and a drive control circuit for the piezoelectric transformer unit; and a cold cathode tube serving as a load of the piezoelectric transformer; and a liquid crystal panel in which brightness control is performed by the light emission control portion.

* * * * *

UNITED STATES PATENT AND TRADEMARK OFFICE
CERTIFICATE OF CORRECTION

PATENT NO.        : 7,030,538 B2
APPLICATION NO. : 10/172589
DATED             : April 18, 2006
INVENTOR(S)       : Nakatsuka et al.

It is certified that error appears in the above-identified patent and that said Letters Patent is hereby corrected as shown below:

Column 16, line 17(claim 4): "arc" should read --are--
Column 16, line 63(claim 7): "liner" should read --linear--
Column 17, line 14(claim 7): "to be is suitable" should read --to be suitable--
Column 17, line 38(claim 9): "front" should read --from--
Column 20, line 62(claim 16): "farmed" should read --formed--

Signed and Sealed this

Sixth Day of March, 2007

JON W. DUDAS
*Director of the United States Patent and Trademark Office*